(12) United States Patent
Hashemi et al.

(10) Patent No.: US 9,865,714 B2
(45) Date of Patent: Jan. 9, 2018

(54) III-V LATERAL BIPOLAR JUNCTION TRANSISTOR

(71) Applicant: INTERNATIONAL BUSINESS MACHINES CORPORATION, Armonk, NY (US)

(72) Inventors: Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/092,224

(22) Filed: Apr. 6, 2016

(65) Prior Publication Data

US 2017/0294525 A1    Oct. 12, 2017

(51) Int. Cl.
| | | |
|---|---|---|
| *H01L 29/10* | (2006.01) | |
| *H01L 29/66* | (2006.01) | |
| *H01L 29/735* | (2006.01) | |
| *H01L 29/205* | (2006.01) | |
| *H01L 29/08* | (2006.01) | |
| *H01L 29/04* | (2006.01) | |

(Continued)

(52) U.S. Cl.
CPC ........ *H01L 29/735* (2013.01); *H01L 21/0254* (2013.01); *H01L 21/02546* (2013.01); *H01L 21/26546* (2013.01); *H01L 21/26586* (2013.01); *H01L 21/3081* (2013.01); *H01L 21/30612* (2013.01); *H01L 29/04* (2013.01); *H01L 29/0808* (2013.01); *H01L 29/0821* (2013.01); *H01L 29/1008* (2013.01); *H01L 29/2003* (2013.01); *H01L 29/205* (2013.01); *H01L 29/207* (2013.01); *H01L 29/6625* (2013.01); *H01L 29/66318* (2013.01); *H01L 29/737* (2013.01)

(58) Field of Classification Search
CPC ........... H01L 21/0254; H01L 21/02546; H01L 21/26546; H01L 21/26586; H01L 21/30612; H01L 21/3081; H01L 29/04; H01L 29/0808; H01L 29/0821; H01L 29/1008; H01L 29/2003; H01L 29/205; H01L 29/207; H01L 29/6625; H01L 29/735; H01L 29/66318; H01L 29/737
See application file for complete search history.

(56) References Cited

U.S. PATENT DOCUMENTS

| | | | | |
|---|---|---|---|---|
| 5,147,775 A | * | 9/1992 | Ota | ........... H01L 29/1004 148/DIG. 10 |
| 6,229,197 B1 | * | 5/2001 | Plumton | ........... H01L 29/66318 257/198 |

(Continued)

*Primary Examiner* — Bitew Dinke
(74) *Attorney, Agent, or Firm* — Tutunjian & Bitetto, P.C.; Louis J. Percello

(57) ABSTRACT

A lateral bipolar junction transistor (LBJT) device that includes an intrinsic III-V semiconductor material having a first band gap; and a base region present on the intrinsic III-V semiconductor material. The base region is composed of an III-V semiconductor material having a second band gap that is less than the first band gap. Emitter and collector regions present on opposing sides of the base region. The emitter and collector regions are composed of epitaxial III-V semiconductor material that is present on the intrinsic III-V semiconductor material.

10 Claims, 4 Drawing Sheets

(51) Int. Cl.
  *H01L 29/737*  (2006.01)
  *H01L 29/20*   (2006.01)
  *H01L 21/02*   (2006.01)
  *H01L 21/265*  (2006.01)
  *H01L 21/308*  (2006.01)
  *H01L 21/306*  (2006.01)
  *H01L 29/207*  (2006.01)

(56)     References Cited

U.S. PATENT DOCUMENTS

| | | | |
|---|---|---|---|
| 6,690,035 B1 * | 2/2004 | Yokogawa | H01L 29/045 |
| | | | 257/194 |
| 8,288,758 B2 | 10/2012 | Ning et al. | |
| 8,420,493 B2 | 4/2013 | Ning et al. | |
| 9,059,016 B1 * | 6/2015 | Hekmatshoar-Tabari | H01L 29/0804 |
| 2010/0187545 A1 * | 7/2010 | Khan | H01L 21/2258 |
| | | | 257/79 |
| 2011/0079796 A1 * | 4/2011 | Wober | H01L 27/14 |
| | | | 257/82 |
| 2012/0139009 A1 * | 6/2012 | Ning | H01L 29/7317 |
| | | | 257/197 |
| 2012/0292665 A1 * | 11/2012 | Marino | H01L 29/1029 |
| | | | 257/194 |
| 2013/0032860 A1 * | 2/2013 | Marino | H01L 29/66462 |
| | | | 257/194 |
| 2013/0076322 A1 * | 3/2013 | Tateno | H02M 1/38 |
| | | | 323/271 |
| 2013/0256684 A1 * | 10/2013 | Nishimori | H01L 29/7783 |
| | | | 257/76 |
| 2013/0256757 A1 * | 10/2013 | Cai | H01L 29/42304 |
| | | | 257/197 |
| 2014/0088401 A1 * | 3/2014 | Cai | H01L 31/1105 |
| | | | 600/407 |
| 2014/0151756 A1 * | 6/2014 | Chang | H01L 29/42392 |
| | | | 257/288 |
| 2014/0367832 A1 * | 12/2014 | Marino | H01L 29/0615 |
| | | | 257/597 |

* cited by examiner

III-V LATERAL BIPOLAR JUNCTION TRANSISTOR

BACKGROUND

Technical Field

The present disclosure relates to a bipolar junction transistor (BJT) structure, and more particularly to lateral bipolar junction transistors.

Description of the Related Art

Heterojunction bipolar junction transistors (HBTs) known in the art include a heterojunction, i.e., a junction of two semiconductor materials having different band gaps, that coincide with a p-n junction between the base and the emitter. The heterojunction at which two different semiconductor materials having different band gaps are joined coincide with the p-n junction. The wider band gap of the emitter relative to the band gap of the base in an HBT increases the current gain relative to a bipolar junction transistor employing a same semiconductor material across the base and the emitter and having similar physical dimensions and doping profiles for the base and emitter.

SUMMARY

In one aspect, the present disclosure provides a lateral bipolar junction transistors (LBJT) device comprising an intrinsic III-V semiconductor material having a first band gap; and a base region present on the intrinsic III-V semiconductor material. The base region may be comprised of an epitaxial III-V semiconductor material being lattice matched to the intrinsic III-V semiconductor material and having a second band gap that is less than the first band gap. The lateral bipolar junction transistor (LBJT) may also include emitter and collector regions present on opposing sides of the base region. The emitter and collector regions can be comprised of epitaxial III-V semiconductor material that is present on the intrinsic III-V semiconductor material having the first band gap. The emitter and collector regions can have the same band gap as the base region, in which the device may be a homojunction type bipolar junction transistor.

In another aspect, the present disclosure provides a lateral bipolar junction transistors (LBJT) device that includes an intrinsic III-V semiconductor material having a first band gap; and a base region present on the intrinsic III-V semiconductor material. The base region may be comprised of a III-V semiconductor material having a second band gap that is smaller than the first band gap. The base region is typically not lattice matched to the intrinsic III-V semiconductor material. The lateral bipolar junction transistor (LBJT) may also include emitter and collector regions present on opposing sides of the base region. The emitter and collector regions can be comprised of epitaxial III-V semiconductor material that is present on the intrinsic III-V semiconductor material having a third band gap that is larger than the second band gap but less than the first band gap. In some embodiments, with emitter and collector regions having a band gap larger than the base band gap, this is a heterojunction bipolar transistor (HBT). In this embodiment, the III-V material that the emitter region, collector region and base region are present on should be composed of the largest band gap material in order to function well as a semi-insulator, such that current from the emitter region or the base region does not inject into it, i.e., inject into the intrinsic III-V semiconductor material having a first band gap.

The net effect of the material selection for the bipolar junction transistors provided herein is that the intrinsic III-V semiconductor material having the first band gap material has the largest band gap, the base region with the second band gap material has the smallest band gap, and the emitter and collector regions with the third band gap material may have the same band gap as the second band gap material that provides the base region or a band gap larger than the base region but smaller than the band gap of material that provides the intrinsic III-V semiconductor material having the first band gap material.

In yet another aspect of the present disclosure, a method of forming a lateral bipolar junction transistor (LBJT) is provided that includes type III-V semiconductor materials. In some embodiments, the method may include providing an intrinsic III-V semiconductor material having a first band gap, and epitaxially forming a lattice matched III-V semiconductor material having a second band gap that is less than the first band gap on the intrinsic III-V semiconductor material. The lattice matched III-V semiconductor material is patterned to produce a base region of the LBJT transistor. An angled ion implantation forms an emitter junction and collector junction on opposing sides of the base region. An epitaxial III-V semiconductor material is formed on the intrinsic III-V semiconductor material to provide an emitter region and a collector region on opposing sides of the base region. The epitaxial III-V semiconductor material for the emitter and collector regions can have the same band gap as the base region, in which the device may be a homojunction type bipolar junction transistor.

In another aspect of the present disclosure, a method of forming a lateral bipolar junction transistor (LBJT) is provided that includes type III-V semiconductor materials. In some embodiments, the method may include forming an intrinsic III-V semiconductor material having a first band gap; and forming a III-V semiconductor material having a second band gap that is smaller than the first band gap on the intrinsic III-V semiconductor material. The III-V semiconductor material having the second band gap is typically not lattice matched to the intrinsic III-V semiconductor material. The III-V semiconductor material having the second band gap is patterned to produce a base region of the LBJT transistor. An angled ion implantation forms an emitter junction and collector junction on opposing sides of the base region. An epitaxial III-V semiconductor material having a third band gap is formed on the intrinsic III-V semiconductor material to provide an emitter region and a collector region on opposing sides of the base region. The third band gap may be larger than the second band gap of the base region, but smaller than the first band gap of the intrinsic III-V semiconductor material.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
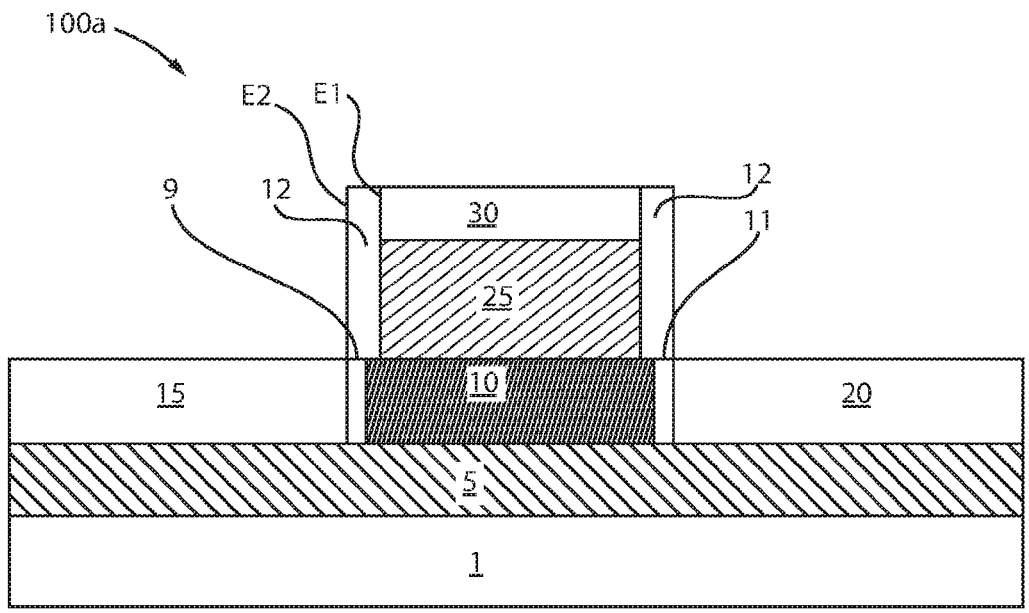
FIG. 1 is a side cross-sectional view of a lateral bipolar junction transistor (LBJT) device that includes a III-V semiconductor base region that is lattice matched to an underlying semi-insulating III-V semiconductor material layer, epitaxially formed emitter and collector regions, and abrupt collector/base and emitter/base junction, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The term "bipolar junction transistor (BJT)" denotes is a semiconductor device formed by two P-N junctions whose function is amplification of an electric current. Bipolar transistors are made from 3 sections of semiconductor material, i.e., alternating P-type and N-type conductivity semiconductor materials, with two resulting P-N junctions. As will be described in greater detail below the (BJT) devices disclosed herein are lateral bipolar junction transistors (LBJT). The term "lateral" as used to describe a BJT device denotes that means that the dimension extending from the beginning of the emitter through the base to the collector is horizontally orientated or is parallel with the upper surface of the substrate in which the emitter/base/collector, i.e., NPN or PNP junction, is formed. The LBJT devices disclosed herein are composed of type III-V semiconductor materials. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. In contrast to type III-V semiconductor materials, by "type IV semiconductor" it is meant that the semiconductor material includes at least one element from Group IVA (i.e., Group 14) of the Periodic Table of Elements.

The present disclosure provides lateral bipolar junction transistors (LBJT), and methods of forming LBJT devices including III-V semiconductor materials. III-V semiconductor materials are great candidates for lateral bipolar junction transistors and can offer high cut off frequency for both NPN and PNP types. Additionally, in some applications a high voltage LBJT device is required for high voltage applications. In some scenarios, controlling the collector/emitter (C/E) doping with ion implantation can be difficult due to depth control of the implantation, which usually results in non-uniform lateral and vertical dopant profiles.

It has been determined that for semiconductor devices including III-V semiconductor materials, that the body of the device can be epitaxially grown on semi-insulating III-V material layers having a high resistivity and higher band gap. As will be described below, this can provide that a sharp junction is formed without requiring multiple ion implantation steps by employing a process sequence that defines the device body after spacer formation, and a tilted, i.e., angled, ion implantation, in which the emitter and collector epitaxial semiconductor material can be grown from the seed of an underlying semi-insulating material layer. The methods and structures of the present disclosure are now described with greater detail with reference to FIGS. 1-8.

FIG. 1 depicts one embodiment of an LBJT device 100a that includes a III-V semiconductor base 10, such as InGaAs, that is lattice matched to an underlying high resistivity undoped III-V material layer 5, such as InAlAs or semi-isolating InP. The undoped III-V material layer is composed of a large band gap material, and provides the deposition surface for the III-V semiconductor base region 10, as well as the III-V semiconductor emitter region 15 and the III-V semiconductor collector region 20 of the LBJT device 100a.

The undoped III-V material layer 5 is a semi-insulating material layer having a large band gap. The term "band gap" refers to the energy difference between the top of the valence band (i.e., EV) and the bottom of the conduction band (i.e., EC). For example, in some embodiments the undoped III-V material layer 5 can have a band gap ranging from about 1.2 eV, e.g. InP has a band gap of 1.34 eV, to larger than 2 eV, e.g., $Al_{70}In_{30}As$ has a band gap of 2.12 eV. For example, in one embodiment, a maximum band gap for the undoped III-V material layer 5 can be 2.5 eV. In one example, the band gap of the undoped III-V material layer 5 is selected to be greater than the semiconductor material that provides the base region 10 of the LBJT device 100a, as depicted in FIG. 1.

By "undoped III-V material layer" it is meant that the III-V material layer does not include an n-type or p-type dopant that has been in situ doped or implanted. The III-V material layer that has not been doped may be referred to as an intrinsic III-V semiconductor material 5, e.g., intrinsic III-V semiconductor material having the first band gap. The intrinsic III-V semiconductor material 5 having the first band gap is a high resistance material. For example, the resistivity of the intrinsic III-V semiconductor material 5 may range from $10^3$ Ω-cm to $10^6$ Ω-cm, and in some examples the resistivity of the intrinsic III-V semiconductor material 5 may be larger than $10^6$ Ω-cm.

The base region 10 is composed of a III-V semiconductor material that can be lattice matched to the intrinsic III-V semiconductor material 5. The base region 10 is the region where an input current triggers a larger current from the emitter 15 to the collector 20 of the transistor. The role of the base region 10 is to function as an amplifier which causes the emitter-to-collector current to be significantly larger than the base current. When the base current receives an input current, a larger current then flows from the emitter region 15 to the collector region 20.

The base region 10 of the transistor has an opposite polarity, i.e., conductivity type, from the emitter region 15 and the collector region 20. The term "conductivity type" means that a region is either doped to an n-type conductivity or a p-type conductivity. For example, when the base region 10 is doped to an n-type conductivity, the emitter region 15 and the collector region 20 is doped to a p-type conductivity, and the transistor is referred to as a PNP transistor. In another example, when the base region 10 is doped to a p-type conductivity, the emitter region 15 and the collector region 20 is doped to an n-type conductivity, and the transistor is referred to as an NPN transistor. In an NPN bipolar transistor, the collector current is due to electrons flowing from the emitter region 15 to the collector region 20. In a PNP bipolar transistor, the collector current is due to holes flowing from the emitter region 15 to the collector region 20.

The base region 10 is typically doped to an n-type or p-type conductivity using a dopant concentration that is less than the dopant concentration in the overlying extrinsic base region 25. For example, the dopant that dictates the conductivity type of the base region 10 may be present in the lattice matched III-V semiconductor material that provides the base region 10 in a concentration ranging from $10^{16}$ atoms/cm$^3$ to $10^{19}$ atoms/cm$^3$.

By "lattice matched" it is meant that there is less than a 0.5% difference in the lattice dimension between the intrinsic III-V semiconductor material 5, and the lattice matched III-V semiconductor material 10 that provides the base region. For example, in one embodiment, the intrinsic III-V semiconductor material 5 may be composed of InAlAs, and the lattice matched III-V semiconductor material 10 is composed of InGaAs. The composition of InGaAs may be adjusted to provide a lattice dimension that matches InAlAs. For example, an InGaAs layer including indium (In) at 53 at. % with a range of plus or minus+/−0.5 at. %, gallium (Ga) at 47 at. % with a range of +/−0.5 at. %, and arsenic (As) at 50 at. % (As) with a range of +/−0.5 at. % can have a lattice dimension that matches the lattice dimension of a layer of InAlAs including indium (In) at 52 at. % with a range of +/−0.5 at. %, aluminum (Al) at 48 at. % with a range of +/−0.5 at. %, and arsenic (As) at 50 at. % with a range of +/−0.5 at. %.

Still referring to FIG. 1, an emitter region 15 and a collector region 20 may be present on opposing sides of the base region 10. The emitter region 15, and the collector region 20 may be composed of epitaxially formed in situ doped III-V semiconductor material. The in situ doped III-V semiconductor material for the emitter region and collector region 15, 20 may be single crystal or polycrystalline. In some embodiments, the epitaxially formed in situ doped III-V semiconductor material that provides the emitter region 15, and the collector region 20 may be composed of a material having a band gap substantially equal to the band gap of the band gap of the base region 10. For example, the in situ doped III-V semiconductor material that provides the emitter region 15, and the collector region 20 may be composed of the same III-V semiconductor material of the base region 10. In other embodiments, the epitaxially formed in situ doped III-V semiconductor material that provides the emitter region 15, and the collector region 20 may be composed of a material having a band gap that is greater than the band gap of the III-V semiconductor material of the base region 10. For example, if the III-V semiconductor material of the base region 10 is composed of InGaAs, which has a band gap of about 0.8 eV, the III-V semiconductor material of the emitter region 15 and collector region 20 may be composed of GaP which has a band gap of about 2.2 eV, or GaAs which has a band gap of about 1.4 eV.

The emitter region 15 and the collector region 20 are typically doped to a conductivity type that is opposite the conductivity type of the baser region 10. For example, if the base region 10 is doped to an n-type conductivity, the emitter region 15 and the collector region 20 are doped to a p-type conductivity. For example, if the base region 10 is doped to a p-type conductivity, the emitter region 15 and the collector region 20 are doped to an n-type conductivity. The dopant that dictates the conductivity type of the emitter region 15 and the collector region 20 may be present in the III-V semiconductor material that provides the emitter region 15 and collector region 20 in a concentration ranging from $10^{18}$ atoms/cm$^3$ to $10^{21}$ atoms/cm$^3$. In some embodiments, the device design may include that the emitter region 15 and collector region 20 are doped more heavily than the base region 10. The epitaxial III-V semiconductor material for the emitter and collector regions 15, 20 can be composed of a semiconductor material, i.e., third band gap material, having the same band gap as the base region 10, in which the device may be a homojunction type bipolar junction transistor. In another embodiment, the band gap of the emitter and collector regions 15, 20 is greater than the band gap of the base region 10, in which the LBJT device 100a may be referred to as a heterojunction device.

An emitter extension region 9 is present between the emitter region 15 and the base region 10. A collector extension region 11 is present between the base region 10 and the collector region 20. The emitter extension region 9 and the collector extension region 11 have a same conductivity type as their respective emitter region 15 and collector region 20. The dopant concentration for the emitter extension region 9 and collector extension region 11 is greater than the dopant concentration in the base region 10. For example, the dopant concentration in each of the emitter extension region 9 and the collector extension region 11 may range from $10^{18}$ atoms/cm$^3$ to $10^{21}$ atoms/cm$^3$.

Still referring to FIG. 1, the LBJT may further include an extrinsic base region 25 that is present atop the base region 10. The extrinsic base region 25 is typically formed of a type III-V semiconductor material. Examples of III-V semiconductor materials suitable for the extrinsic base include indium aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof. The extrinsic base region 25 is typically doped to a same conductivity type as the base region 10. For example, if the base region 10 is doped to an n-type conductivity, the extrinsic base region 25 is also doped to an n-type conductivity. The dopant concentration of the extrinsic base region 25 is typically greater than the dopant concentration of the base region 10. For example, the dopant concentration of the n-type or p-type dopant in the extrinsic base region 25 may range from $10^{18}$ atoms/cm$^3$ to $10^{21}$ atoms/cm$^3$. The extrinsic base region 25 is present within the width of the base region 10. Spacers 12 of a dielectric material, such as an oxide, nitride or oxynitride material, are present on the sidewalls of the extrinsic base region 25. The LBJT device that is depicted in FIG. 1 may be present on a semiconductor substrate 1 composed of a type III-V semiconductor material or type IV semiconductor material.

In some embodiments, the LBJT device 100a that is depicted in FIG. 1 may be suitable for high speed applications, in which a small gap III-V base, i.e., base region 10 composed of small band gap III-V semiconductor material, and similar or slightly higher bandgap material for the emitter and collector region is preferred.

Figure 2:
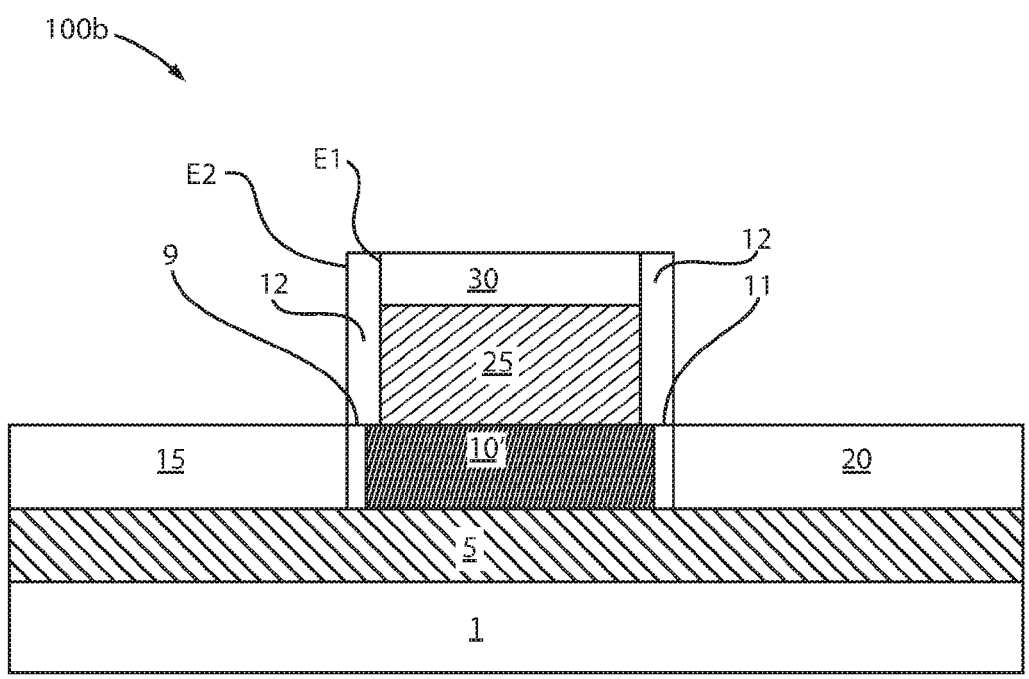
FIG. 2 is a side cross-sectional view of another embodiment of a lateral bipolar junction transistor (LBJT) device that includes a high bandgap III-V base, epitaxially formed emitter and collector regions, and an abrupt collector/base junction and emitter/base junction on high bandgap and high resistivity undoped III-V layers on type III-V or type IV substrates, in accordance with one embodiment of the present disclosure.

FIG. 2 depicts another embodiment of the present disclosure. FIG. 2 depict a lateral bipolar junction transistor (LBJT) device 100b that includes an intrinsic III-V semiconductor material 5 having a first band gap; and a base region 10' present on the intrinsic III-V semiconductor material 5. In the embodiment that is depicted in FIG. 2, the base region 10' is not lattice matched with the intrinsic III-V semiconductor material 5. The base region 10' is composed of a III-V semiconductor material having a second band gap that is less than the first band gap. In one embodiment, the first band gap of the intrinsic III-V semiconductor material 5 ranges from 5.0 eV to 6.5 eV, and the second band gap of the III-V semiconductor material that provides the base region 10' ranges from 3.0 eV to 4.0 eV. In one example, the intrinsic III-V semiconductor material 5 having the first band gap is AlGaN and the epitaxial III-V semiconductor material that provides the base region 10' having the second band gap is GaN. In the embodiment that is depicted in FIG. 2, the base region 10' that is composed of GaN is not lattice matched with the intrinsic III-V semiconductor material 5.

The lateral bipolar junction transistor (LBJT) device may further include emitter and collector regions 15, 20 comprised of epitaxial III-V semiconductor material that is present on the intrinsic III-V semiconductor material 5 having the first band gap. The epitaxial III-V semiconductor material that provides the emitter and collector regions 15, 20 may be an in-situ doped III-V semiconductor material having a third band gap that is equal to or greater than the second band gap of the base region 10'. For example, in the embodiments in which the band gap of the emitter and collector regions 15, 20 is greater than the base region 10', the third band gap of the semiconductor material that provides the emitter and collector regions 15, 20 may be larger than the second band gap of the base region 10', but smaller than the first band gap of the intrinsic III-V semiconductor material 5. In the embodiments, in which the band gap of the emitter and collector regions 15, 20 is substantially equal to the band gap of the base region 10', the LBJT device 100b may be referred to as a homojunction device. In the embodiments, in which the band gap of the emitter and collector regions 15, 20 is greater than the band gap of the base region 10', the LBJT device 100b may be referred to as a heterojunction device. The above description of the emitter and collector regions 15, 20 depicted in FIG. 1 provides further details for the description of the emitter and collector regions 15, 20 of the LBJT device depicted in FIG. 2.

Referring to FIG. 2, an emitter extension region 9 is present between the emitter region 15 and the base region 10. A collector extension region 11 is present between the base region 10 and the collector region 20. The emitter extension region 9 and the collector extension region 11 have a same conductivity type as their respective emitter region 15 and collector region 20. The dopant concentration for the emitter extension region 9 and collector extension region 11 is greater than the dopant concentration in the base region 10'. For example, the dopant concentration in each of the emitter extension region 9 and the collector extension region 11 may range from $10^{18}$ atoms/cm$^3$ to $10^{21}$ atoms/cm$^3$.

The lateral bipolar junction transistor (LBJT) device depicted in FIG. 2 may further include an extrinsic base region 25 composed of a doped III-V semiconductor material. The extrinsic base region 25 that is depicted in FIG. 2 is similar to the extrinsic base region 25 depicted in FIG. 1. Therefore, the above description of the extrinsic base region 25 depicted in FIG. 1 may be suitable for the description of extrinsic base region 25 of the LBJT device depicted in FIG. 2. Additionally, the spacers 12 and the semiconductor substrate 1 depicted in FIG. 2 have been described above with reference to FIG. 1.

In one example, the LBJT device 100b that is depicted in FIG. 2 includes a large bandgap III-V base, such as GaN; epitaxially formed emitter and collector regions; abrupt collector/base and emitter/base junction on the large bandgap and high resistivity undoped III-V layers, such as AlGaN, on III-V or IV type substrates. In some embodiments, the aforementioned device may be suitable for high speed and high voltage applications (high breakdown).

Figure 3:
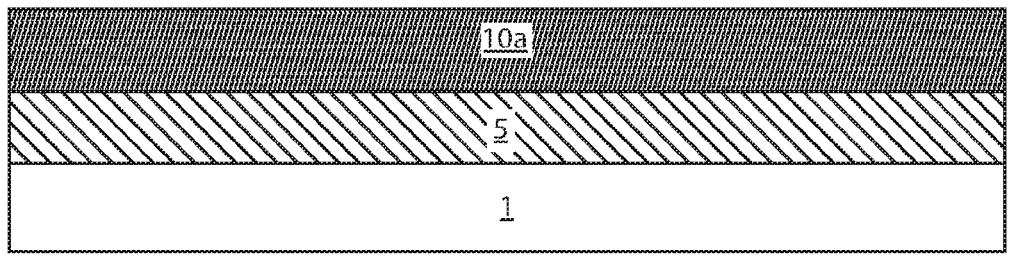
FIG. 3 is a side cross-sectional view of an initial structure for forming a lateral bipolar junction transistor (LBJT) that includes a III-V semiconductor material layer for a base region of the LBJT device formed on a semi insulating III-V semiconductor material layer, in which the band gap of the material layer for the base region is less than the band gap of the semi insulating III-V semiconductor material layer, in accordance with one embodiment of the present disclosure.

FIGS. 3-8 depict one embodiment of a method for forming the LBJT devices depicted in FIGS. 1 and 2. FIG. 3 depicts one embodiment of an initial structure for forming a lateral bipolar junction transistor (LBJT) that includes a lattice matched III-V semiconductor material layer 10a for a base region 10 of the LBJT device formed on a semi insulating (also referred to as intrinsic) III-V semiconductor material layer 5. The intrinsic III-V semiconductor material layer 5 may be present atop a semiconductor substrate 1.

The semiconductor substrate 1 may be composed of type III-V semiconductor materials and may also include type IV semiconductor materials. For example, the semiconductor substrate 1 may be composed of indium phosphide (InP) or indium phosphide (InP) on silicon (Si). Other III-V semiconductor materials that can provide the semiconductor substrate may include indium aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof. The semiconductor substrate 1 is typically composed of a single crystalline material. Examples of type IV semiconductor materials for the semiconductor substrate 1 include silicon (Si), germanium (Ge) and silicon germanium (Ge).

The intrinsic III-V semiconductor material layer 5 may be epitaxially formed atop the semiconductor substrate 1. An "intrinsic semiconductor", also called an undoped semiconductor or i-type semiconductor, is a pure semiconductor without any significant dopant species present. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

A number of different sources may be used for the deposition of epitaxial type III-V semiconductor material for the intrinsic III-V semiconductor material layer 5. In some embodiments, the sources for epitaxial growth of type III-V semiconductor material include liquid or solid sources containing In, Al, As, Ga, N, P elements and combinations thereof and/or a gas precursor selected from the group consisting of Trimethylaluminum $(CH_3)_3Al$, Trimethylgallium $(CH_3)_3Ga$, (TMG), Trimethylindium (TMI) $(CH_3)_3IN$, tertiary-butylphosphine (TBP), tertiary-butylarsine (TBA), phosphine $(PH_3)$, arsine (AsH3) ammonia $(NH_3)$, and combinations thereof. The temperature for epitaxial deposition of type III-V semiconductor materials typically ranges from 350° C. to 700° C.

In some embodiments, the intrinsic III-V semiconductor material layer 5 may be composed of InAlAs (to provide the LBJT device depicted in FIG. 1) or the intrinsic III-V semiconductor material layer 5 may be composed of AlGaN (to provide the LBJT device depicted in FIG. 2). When forming an LBJT device, as depicted in FIG. 1, the composition of the intrinsic III-V semiconductor material layer 5 is selected to have a band gap that is greater than the later formed base region 10. When forming an LBJT device, as depicted in FIG. 2, the composition of the intrinsic III-V semiconductor material layer 5 is selected to have a band gap that is larger than the high band gap of the subsequently formed base region 10'.

The thickness of the intrinsic III-V semiconductor material layer 5 may range between 10 nm to 1000 nm.

The III-V semiconductor material layer 10a for the base region 10, 10' of the LBJT device can be epitaxially formed on the intrinsic III-V semiconductor material layer 5. In some embodiments, the III-V semiconductor material 10a is epitaxially formed to lattice match the underlying intrinsic III-V semiconductor material layer 5 to provide a lattice matched base region 10, as depicted in FIG. 1. In other embodiments, the III-V semiconductor material 10a is deposited using a deposition process that produces a base region 10' that is not lattice matched, as depicted in FIG. 2. The III-V semiconductor material 10a is selected to have a band gap less than the band gap of the intrinsic III-V semiconductor material layer 5. In some embodiments, when the intrinsic III-V semiconductor material layer 5 is composed of InAlAs, to provide a lattice matched III-V semiconductor material 10a having a band gap less than the intrinsic III-V semiconductor material layer 5, the lattice matched III-V semiconductor material 10a may be composed of InGaAs, which provides a LBJT device 100A, as depicted in FIG. 1. In some embodiments, when the intrinsic III-V semiconductor material layer 5 is composed of AlGaN, to provide a III-V semiconductor material 10a having a band gap less than the intrinsic III-V semiconductor material layer 5 that is not lattice matched to the intrinsic III-V semiconductor material layer 5, the III-V semiconductor material 10a may be composed of GaN, which provides a LBJT device 100B, as depicted in FIG. 2.

In one example, the composition of the intrinsic III-V semiconductor material 5 and the lattice matched III-V semiconductor material 10a is selected so that there is less than a 0.5% difference in the lattice dimension between the intrinsic III-V semiconductor material 5, and the lattice matched III-V semiconductor material 10a that provides the base region 10. For example, in one embodiment, the intrinsic III-V semiconductor material 5 may be composed of InAlAs, and the lattice matched III-V semiconductor material 10a is composed of InGaAs.

In some embodiments, the sources for epitaxial growth of type III-V semiconductor material include solid sources containing In, Al, As, Ga, N, P elements and combinations thereof and/or a gas precursor selected from the group consisting of Trimethylaluminum $(CH_3)_3Al$, Trimethylgallium $(CH_3)_3Ga$, (TMG), Trimethylindium (TMI) $(CH_3)_3IN$, tertiary-butylphosphine (TBP), tertiary-butylarsine (TBA), phosphine $(PH_3)$, arsine (AsH3) ammonia $(NH_3)$, and combinations thereof. The temperature for epitaxial deposition of type III-V semiconductor materials typically ranges from 350° C. to 700° C.

The III-V semiconductor material layer 10a for the base region 10, 10' is doped to an n-type or p-type conductivity. The III-V semiconductor material layer 10a for the base region 10, 10' may be in situ doped. The term "in situ" denotes that the dopant that dictates the conductivity type of a material is introduced while the material is being formed, e.g., during the epitaxial growth process. The term "p-type" refers to the addition of impurities to an intrinsic semiconductor that creates deficiencies of valence electrons. As used herein, "n-type" refers to the addition of impurities that contributes free electrons to an intrinsic semiconductor. To provide an n-type dopant to the III-V semiconductor material, the dopant may be an element from Group IV or VI of the Periodic Table of Elements. To provide a p-type dopant to the III-V semiconductor material, the dopant may be an element from Group II or VI of the Periodic Table of Elements. In an III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. In some examples, the dopants that dictate the n-type or p-type conductivity may include silicon (Si), iron (Fe), germanium (Ge) and combinations thereof. In other embodiments, the dopant that provides the conductivity type of the lattice matched III-V semiconductor material 10a may also be implanted using gas phase doping or ion implantation.

Figure 4:
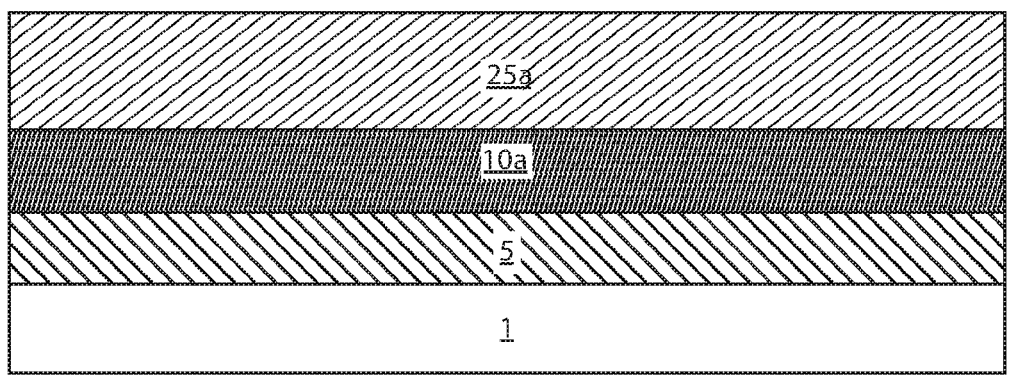
FIG. 4 is a side cross-sectional view of forming a material layer for an extrinsic base region of the LBJT device that includes doped polycrystalline or single crystalline III-V semiconductor materials, in accordance with one embodiment of the present disclosure.

FIG. 4 depicts forming a material layer 25a for an extrinsic base region of the LBJT device that includes doped polycrystalline or single crystalline III-V semiconductor materials. The material layer 25a for the extrinsic base 25 can be formed using similar epitaxial deposition methods as described above for forming the lattice matched III-V semiconductor material 10a and the intrinsic III-V semiconductor material 5. In some embodiments, the material layer 25a for the extrinsic base region 25 does not need to be epitaxially formed, e.g., when the material layer 25a for the extrinsic base region is composed of a polycrystalline material. The material layer 25a may be deposited using chemical vapor deposition in which the deposition conditions are configured to form a polycrystalline material. The thickness for the material layer 25a for an extrinsic base region 25 of the LBJT device may range from 10 nm to 1000 nm.

The material layer 25a for an extrinsic base region 25 of the LBJT device is typically doped to a same conductivity type as the lattice matched III-V semiconductor material layer 10a that provides the base region 10, 10'. The dopant concentration of the material layer 25a may range from $10^{18}$ atoms/cm$^3$ to $10^{21}$ atoms/cm$^3$. The dopant may be implanted by ion implantation, or introduced in situ by gas phase doping.

Figure 5:
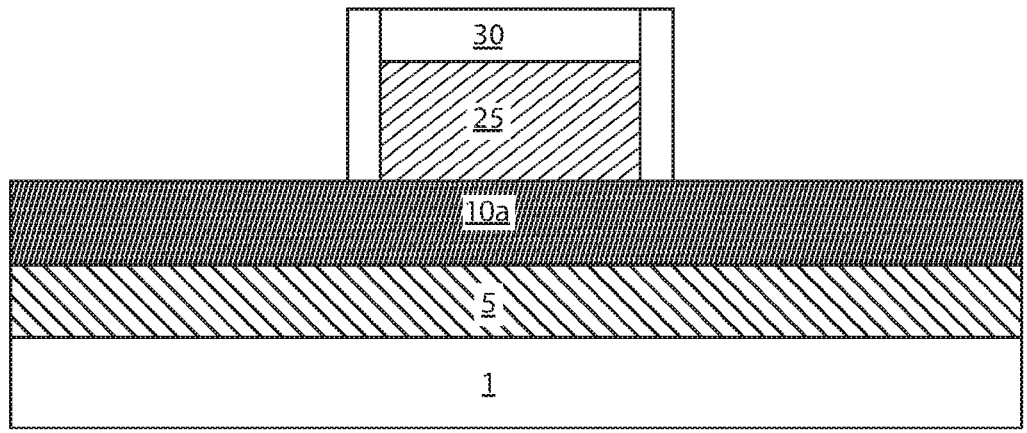
FIG. 5 is a side cross-sectional view depicting forming a hardmask on the material layer for the extrinsic base region of the LBJT device, and patterning the material layer for the extrinsic base region of the LBJT device, in accordance with one embodiment of the present disclosure.

FIG. 5 depicts forming a hardmask 30 on the material layer for the extrinsic base region 25 of the LBJT device, and patterning the material layer for the extrinsic base region 25 of the LBJT device. Forming a hardmask 30 may begin with depositing a dielectric layer on the upper surface of the material layer for the extrinsic base region 25. The dielectric layer that provides the hardmask 30 may be composed of an oxide, nitride, oxynitride, metal oxide or combination thereof. For example, when the hardmask 30 is composed of a nitride, the nitride may be provided by silicon nitride. The material layer for the hardmask 30 may be blanket deposited using chemical vapor deposition, e.g., plasma enhanced chemical vapor deposition (PECVD). The dielectric layer may then be patterned using photolithography and etch process, which can begin with forming a photoresist block mask. A photoresist block mask can be produced by applying a photoresist layer, exposing the photoresist layer to a pattern of radiation, and then developing the pattern into the photoresist layer utilizing conventional resist developer. The portions of the dielectric layer that are protected by the photoresist block mask remain to provide the hardmask 30, and the portions of the dielectric layer that are not protected by the photoresist block mask are removed by an etch process. The etch process for removing the exposed portions of the dielectric layer in patterning the hardmask 30 may be an anisotropic etch, such as reactive ion etch or laser etch, or an isotropic etch, such as a wet chemical etch.

Following formation of the hard mask 30, the exposed portions of the material layer 25a for the extrinsic base region 25 may be etched, i.e., removed, to expose an upper surface of the underlying lattice matched III-V semiconductor layer 10a. In one embodiment, the etch process for etching the exposed surfaces of the material layer 25a for the extrinsic base region 25 may be an anisotropic etch. An "anisotropic etch process" denotes a material removal process in which the etch rate in the direction normal to the surface to be etched is greater than in the direction parallel to the surface to be etched. One form of anisotropic etching that is suitable for etching the material layer 25a is reactive ion etching (RIE). The etch process may be timed until the upper surface of the underlying lattice matched III-V semiconductor layer 10a is exposed.

Figure 6:
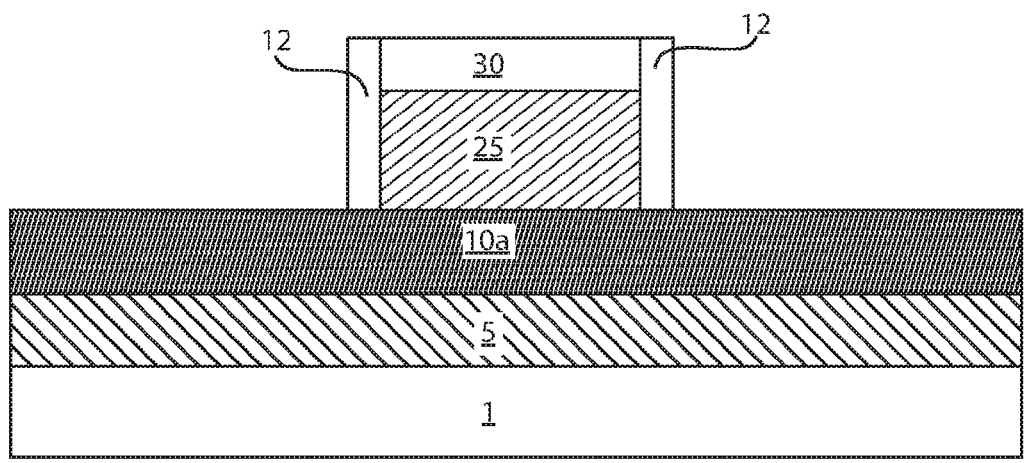
FIG. 6 is a side cross-sectional view depicting forming a spacer on the extrinsic base region, in accordance with one embodiment of the present disclosure.

FIG. 6 depicts one embodiment of forming a spacer 12 on the sidewalls of the extrinsic base region. The dielectric spacer 12 includes a dielectric material such as silicon oxide, silicon nitride, silicon oxynitride, organosilicate glass, or a combination thereof. The dielectric spacer 12 can be formed, for example, by conformal deposition of a dielectric material layer and subsequent anisotropic etch that removes the horizontal portions of the deposited dielectric material layer. The term "conformal layer" denotes a layer having a thickness that does not deviate from greater than or less than 30% of an average value for the thickness of the layer. The conformal deposition of the dielectric material layer can be performed, for example, by chemical vapor deposition (CVD), atomic layer deposition (ALD), or a combination thereof.

Figure 7:
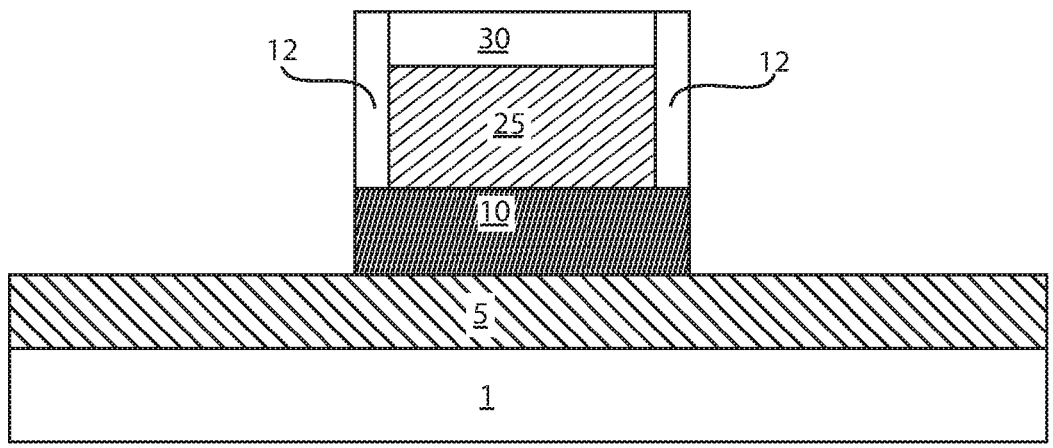
FIG. 7 is a side cross-sectional view depicted etching the III-V semiconductor material layer to provide the base region of the LBJT device.

FIG. 7 depicts one embodiment of etching the lattice matched III-V semiconductor material layer 10a to provide the base region 10 of the LBJT device. The exposed portions of the lattice matched III-V semiconductor material layer 10a may be removed while the portions of the lattice matched III-V semiconductor material layer 10a underlying the spacer 12, and the hardmask 30 are protected from being removed by the etch. The etch process for etching the lattice matched III-V semiconductor material layer 10a may be selective to the dielectric spacer 12, the hardmask 30 and the underlying intrinsic III-V semiconductor material layer 5. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. The etch process for removing the exposed portions of the lattice matched III-V semiconductor material layer 10 may be a wet etch or a dry etch.

Figure 8:
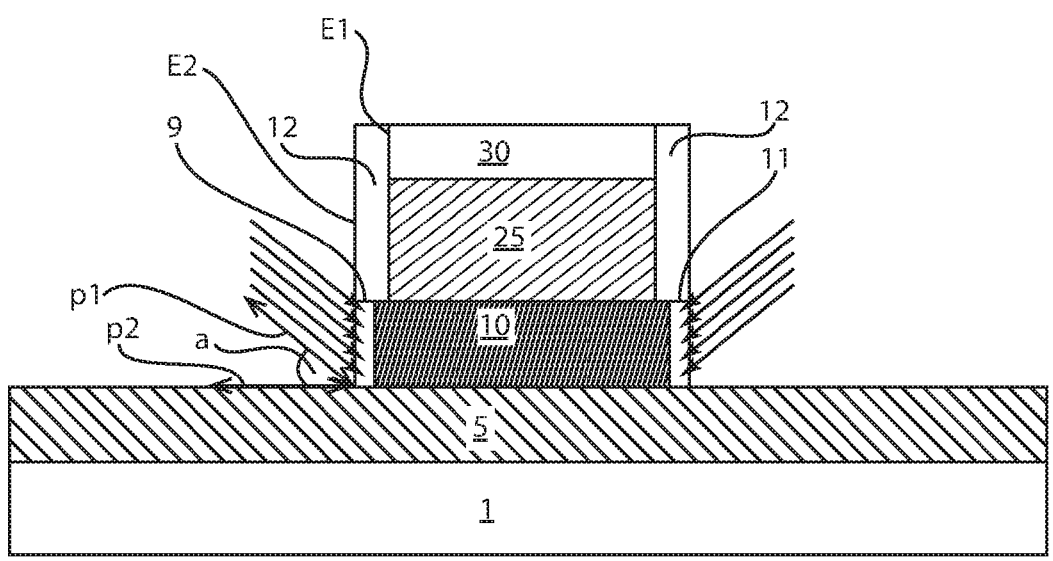
FIG. 8 is a side cross-sectional view depicting forming the emitter and collector extension regions with the base region using an angled ion implant and an anneal process, in accordance with one embodiment of the present disclosure.

FIG. 8 depicts forming the emitter and collector extension regions 9, 11 from the base region 10 using an angled ion implant and an anneal process. The emitter and collector extension regions 9, 11 are doped to a conductivity type that is opposite the conductivity type of the base region 10. For example, if the base region 10 has an n-type conductivity, the emitter and collector extension regions 9, 11 are doped to a p-type conductivity. In another example, if the base region 10 has a p-type conductivity, the emitter and collector extension regions 9, 11 are doped to an n-type conductivity.

The dopants for the emitter and collector extension regions 9, 11 are introduced by angled ion implantation, and extend beneath the outside edge E2 of the spacer 12, but not extend in a significant amount, i.e., concentration, beyond the inside edge E1 of the spacer 12. Thus, after the formation of the emitter extension region 9 and the collector extension region 11 from the base region 10, the base region having a doping type that is opposite to the doping type of the emitter and collector extension regions is now smaller. The emitter and collector extension regions 9, 11 form emitter-base and collector-base junctions of the LBJT. For example, for an NPN LBJT, the base region 10 is doped p-type and the emitter and collector extension regions 9, 11 are doped n-type. The emitter-base junction of the LBJT is located at the interface between the n-type doped emitter extension region 9 and the p-type doped base region 10, and the collector-base junction of the LBJT is located at the interface between the n-type doped collector extension region 11 and the p-type doped base region 10. Angled ion implantation as used throughout the instant application denotes that dopants are implanted towards the surface of the exposed sidewall surface of the base region 10 along a plane P1 that forms an acute angle α when intersecting with the plane P2 that is substantially parallel to the surface of the intrinsic III-V semiconductor material layer 5. The angled ion implantation may include an angle α ranging from 3° to 75°. In another embodiment, the angled ion implantation includes an angle α ranging from 5° to 60°. Preferably, the angled ion implantation includes an angle α ranging from 15° to 45°. The dopant that produces the emitter and collector extension regions 9, 11 may include silicon (Si), iron (Fe), germanium (Ge) and combinations thereof. The dopant concentration of the emitter and collector extension regions 9, 11 may range from $10^{18}$ atoms/cm$^3$ to $10^{21}$ atoms/cm$^3$.

Following the angled ion implantation, the structure may be annealed. The anneal may be conducted by furnace, rapid thermal anneal (RTA) or laser anneal. The temperature of the anneal process may range from 600° C. to 1100° C., in which the time and temperature of the anneal is selected to avoid excess diffusion of the emitter and collector extension regions 9, 11 with the base region 10, so as to maintain the abrupt characterization of the emitter-base and collector-base junctions.

In a following process step, the emitter and collector regions 15, 20 of the LBJT device are formed by epitaxial deposition to provide the structures depicted in FIGS. 1 and 2. The emitter and collector regions 15, 20 are typically composed of epitaxially formed in-situ doped III-V semiconductor material. The emitter and collector regions 15, 20 may be composed of single crystalline or polycrystalline material. The emitter and collector regions 15, 20 may be composed of a III-V semiconductor material having a band gap that is the same or greater than the band gap of the base region 10. For example, the epitaxially formed in-situ doped III-V semiconductor material may be composed of at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof, so long as providing a band gap that is equal to or greater than the base region 10.

The epitaxial deposition and in-situ doping process for forming the epitaxially formed in-situ doped single crystal III-V semiconductor material that provides the emitter and collector regions 15, 20 has been described above for forming the lattice matched III-V semiconductor material that provides the base region 10. Therefore, the above description for epitaxial grown and in-situ doping for the lattice matched III-V semiconductor material that provides the base region 10 is suitable for providing at least one embodiment of forming the material layers for the emitter and collector regions 15, 20. The emitter and collector regions 15, 20 are doped with a conductivity type dopant that is opposite the conductivity type of the base region 10. The emitter and collector regions 15, 20 are doped with a conductivity type dopant that is the same conductivity type as the emitter and collector extension regions. The dopant that produces the n-type or p-type conductivity may be selected from silicon, germanium and iron. The dopant concentration of the emitter and collector regions 15, 20 may range from $10^{18}$ atoms/cm$^3$ to $10^{21}$ atoms/cm$^3$.

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A lateral bipolar junction transistor (LBJT) device comprising:
   an intrinsic III-V semiconductor material having a first band gap, wherein the intrinsic III-V semiconductor material having the first band gap is InAlAs;
   a base region present on the intrinsic III-V semiconductor material having the first band gap, wherein the base region is comprised of an epitaxial III-V semiconductor material being lattice matched to the intrinsic III-V semiconductor material and having a second band gap that is less than the first band gap, wherein the epitaxial III-V semiconductor material being lattice matched to the intrinsic III-V semiconductor material is InGaAs; and
   emitter and collector regions present on opposing sides of the base region, wherein the emitter and collector regions are comprised of an epitaxial III-V semiconductor material that is present on the intrinsic III-V semiconductor material.

2. The lateral bipolar junction transistor (LBJT) device of claim 1 further comprising an extrinsic base region comprised of a doped polycrystalline III-V semiconductor material or a doped single crystalline III-V semiconductor material, wherein a dopant concentration that provides a conductivity type of the extrinsic base region is greater than a dopant concentration that provides a conductivity type of the base region.

3. The lateral bipolar junction transistor (LBJT) device of claim 1, wherein the first band gap ranges from 1.4 eV to 2.2 eV, and the second band gap ranges from 0.4 eV to 1.4 eV.

4. The lateral bipolar junction transistor (LBJT) device of claim 1, wherein the epitaxial III-V semiconductor material that provides the emitter and collector regions is an in-situ doped III-V semiconductor material having a band gap equal to the second band gap.

5. The lateral bipolar junction transistor (LBJT) device of claim 1, wherein the epitaxial III-V semiconductor material that provides the emitter and collector regions is an in-situ doped III-V semiconductor material having a band gap greater than the second band gap and less than the first band gap.

6. A lateral bipolar junction transistor (LBJT) device comprising:
   an intrinsic III-V semiconductor material having a first band gap, wherein the first band gap ranges from 5.0 eV to 6.5 eV;
   a base region present on the intrinsic III-V semiconductor material having the first band gap, wherein the base region is comprised of an III-V semiconductor material having a second band gap that is less than the first band gap, the second band gap ranges from 3.0 eV to 4.0 eV, wherein the III-V semiconductor material of the base region not being lattice matched to the intrinsic III-V semiconductor material; and
   emitter and collector regions comprised of epitaxial III-V semiconductor material that is present on the intrinsic III-V semiconductor material having the first band gap.

7. The lateral bipolar junction transistor (LBJT) device of claim 6 further comprising an extrinsic base region comprised of a doped polycrystalline III-V semiconductor material or a doped single crystalline III-V semiconductor material, wherein a dopant concentration that provides a conductivity type of the extrinsic base region is greater than a dopant concentration that provides a conductivity type of the base region.

8. The lateral bipolar junction transistor (LBJT) device of claim 6, wherein the epitaxial III-V semiconductor material that provides the emitter and collector regions is an in-situ doped III-V semiconductor material having a band gap equal to the second band gap.

9. The lateral bipolar junction transistor (LBJT) device of claim 6, wherein the epitaxial III-V semiconductor material that provides the emitter and collector regions is an in-situ doped III-V semiconductor material having a band gap greater than the second band gap and less than the first band gap.

10. A lateral bipolar junction transistor (LBJT) device comprising:
    an intrinsic III-V semiconductor material having a first band gap, wherein the intrinsic III-V semiconductor material having the first band gap is AlGaN;
    a base region present on the intrinsic III-V semiconductor material having the first band gap, wherein the base region is comprised of an III-V semiconductor material having a second band gap that is less than the first band gap, the epitaxial III-V semiconductor material having the second band gap is GaN, wherein the III-V semiconductor material of the base region not being lattice matched to the intrinsic III-V semiconductor material; and
    emitter and collector regions comprised of epitaxial III-V semiconductor material that is present on the intrinsic III-V semiconductor material having the first band gap.

* * * * *